United States Patent
Gaul et al.

[11] Patent Number: 5,807,783
[45] Date of Patent: Sep. 15, 1998

[54] SURFACE MOUNT DIE BY HANDLE REPLACEMENT

[75] Inventors: Stephen Joseph Gaul, Merrimack, N.H.; Jose Avelino Delgado, Valkaria, Fla.

[73] Assignee: Harris Corporation, Melbourne, Fla.

[21] Appl. No.: 726,659

[22] Filed: Oct. 7, 1996

[51] Int. Cl.⁶ .................................................. H01L 21/76
[52] U.S. Cl. ........................ 438/406; 438/459; 438/667; 438/928; 438/977
[58] Field of Search .................................. 438/406, 459, 438/667, 928, 977

[56] References Cited

U.S. PATENT DOCUMENTS

| | | | |
|---|---|---|---|
| 3,911,559 | 10/1975 | Bean et al. | 438/412 |
| 4,889,832 | 12/1989 | Chatterjee | 438/270 |
| 4,892,842 | 1/1990 | Corrie et al. | 438/59 |
| 4,923,825 | 5/1990 | Blouke et al. | 438/64 |
| 4,982,266 | 1/1991 | Chatterjee | 257/66 |
| 5,004,705 | 4/1991 | Blackstone | 438/455 |
| 5,091,331 | 2/1992 | Delgado et al. | 438/458 |
| 5,308,779 | 5/1994 | Sarma | 438/164 |
| 5,312,765 | 5/1994 | Kanber | 438/59 |
| 5,387,555 | 2/1995 | Linn et al. | 438/455 |
| 5,424,245 | 6/1995 | Gurtler et al. | 438/107 |
| 5,569,620 | 10/1996 | Linn et al. | 438/406 |
| 5,569,621 | 10/1996 | Yallup et al. | 438/404 |
| 5,589,419 | 12/1996 | Ochiai | 438/158 |
| 5,618,752 | 4/1997 | Gaul | 438/626 |
| 5,643,821 | 7/1997 | Beasom | 438/355 |

*Primary Examiner*—John Niebling
*Assistant Examiner*—David Zarneke
*Attorney, Agent, or Firm*—Jaeckle Fleischmann & Mugel, LLP

[57] ABSTRACT

A bonded wafer has a first handle wafer 12, a device layer 10', an interconnect layer 14, and a number of vias filled with conductive material that extends between the surfaces 6, 8 of the device layer 10'. the interconnect layer 14 has conductors that connect internal device contacts to the conductive vias. A second handle wafer 40 of glass is bonded to the interconnect layer 14 and the first handle wafer is removed. Bottom, external contacts 36 are formed on surface 6 of device layer 10'.

31 Claims, 4 Drawing Sheets

5,807,783

SURFACE MOUNT DIE BY HANDLE REPLACEMENT

BACKGROUND

Integrated circuits comprise a plurality of devices that are formed in one surface of a semiconductor substrate. A typical integrated circuit has a number of bond pads on the periphery of the die and surrounding active devices of the integrated circuit. The bond pads are connected through an interconnect layer to one or more terminals of the devices in the integrated circuit. The interconnect layer includes a dielectric material that insulates interconnecting conductors from each other. The conductors extend from device terminals to the bond pads. The semiconductor die is mounted on a central platform of a lead frame that has a plurality of fingers radially extending from a peripheral metal frame towards the central platform. Very thin wire bonds, typically of gold or gold and aluminum alloy, connect the bond pads of the integrated circuit to the lead fingers on the lead frame. Then the integrated circuit is encapsulated in plastic or ceramic, the frame members are trimmed, and the external leads are bent into their appropriate form. The external leads are connected to other integrated circuits, power supplies, or other electronic components.

Bond wires are a source of parasitic inductance. That inductance can be particularly troublesome at high frequencies. In order to eliminate bond wire parasitic inductance, others have proposed using bump type connectors for contacting the external integrated circuit contacts, i.e. bond pads.

Integrated circuits generate heat during operation. Accordingly, removal of that heat is important in order to keep the integrated circuits from failing. Others have used heat sinks and special packages for removing heat from the integrated circuit die. Accordingly, it is desirable to provide a method and apparatus that quickly removes heat from the integrated circuit.

Still another problem with integrated circuits is the thickness of epitaxial layers. This problem is particularly acute in power devices, such as quasivertical DMOS devices (QVDMOS). Those devices have a relatively large buried layer that forms the drain contact for the QVDMOS device. The QVDMOS device also has a large heavily doped vertical drain diffusion for contacting the buried horizontal layer. In the QVDMOS device, source regions are separated by a common gate. In operation, the gate vertically couples the source to the buried layer drain diffusion. The buried layer drain diffusion is itself coupled to the surface via the surface drain diffusion.

Such QVDMOS devices have two disadvantages. For one, in order to sufficiently space the source regions from the buried layer region the heavily doped buried layer requires a substantially thick epitaxial layer. The epitaxial region is often required to be in excess of 20 microns in order to provide sufficient spacing between the source and buried layer. Growing epitaxial layers above 20 microns is both difficult and time consuming. The epitaxial process requires more time to grow thicker layers than to grow thin layers. Moreover, thick layers are notorious for having stacking faults and other defects. The other disadvantage is the relatively large sinker diffusion that is required for making contact to the buried layer. Due to the thickness of the epitaxial region, the vertical drain diffusion to the buried layer expands laterally during formation. As such, substantial portions of the integrated circuit die are only used to establish contacts to a buried layer.

Others have proposed solutions to some of these problems by establishing conductive vias between the surface of a device layer and a buried layer. However, even with highly selective etching techniques, the size of such conductive vias is often equal to or greater than the extent of a lateral diffusion of the vertical drain diffusion. In addition, the fabrication and metallization of deep vias is extremely difficult.

In U.S. Pat. No. 4,889,832 there is shown a scheme for using conductive vias to interconnect multiple epitaxial layers of a device. That patent relies upon depositing multiple epitaxial layers to form stacks of transistors in the multiple epitaxial layers. The devices are not formed in the face of one device layer but rather are formed in multiple device layers stacked on top of one another. Others show techniques for exposing the backside surface of a device wafer for making contact to topside surface diffusions that extend from the backside surface. See, for example, U.S. Pat. No. 5,004,705, in particular FIGS. 10 and 11. Another example of using a conductive via to provide a backside contact is found in U.S. Pat. No. 5,424,245. However, the later patent does not thin the device wafer to expose either a buried layer contact or a diffusion made from the topside surface. It also does not address the problem of thick epitaxial layers in QVDMOS devices. Still other examples of patents that show processing techniques on the backside surface of a wafer opposite the topside surface that receives the diffusion are shown in U.S. Pat. Nos. 5,308,779; 4,892,842; and 3,991,599.

Accordingly, there has been a long felt need for devices that minimize or eliminate bond wire parasitic inductances, that rapidly remove heat from integrated circuits, and that minimize the area consumed by vertical diffusions to buried layers.

SUMMARY

The invention provides an integrated circuit and a method for fabricating an integrated circuit that achieve the above objectives. The method includes a step of bonding a device wafer to a first handle wafer. In the preferred embodiment, an etch stop layer is formed between the device layer and the first handle wafer. The etch stop layer is typically a layer of silicon dioxide but may also be a heavily doped boron region in either the device wafer or the handle wafer. The device wafer is thinned through chemical or mechanical polishing or both to provide a thin device layer which can rapidly dissipate heat. The device layer is patterned to form isolating trenches between adjacent devices of an integrated circuit. The trenches are filled with dielectric material. A second set of trenches is formed to create vias between the first or upper surface of the device layer and the second or lower surface of the device layer. The sidewalls of the vias are passivated with a dielectric such as silicon oxide or silicon nitride and the vias are filled with conductive material, such as doped polysilicon, aluminum, or a refractory metal, such as titanium or tungsten. Devices are formed in the first surface of the device wafer. The devices may include field effect transistors, bipolar transistors, vertical field effect transistors, and field effect transistors with programmable back gates. Each device has one or more internal device contacts on the first surface of the device layer. An interconnect layer is formed over the first surface of the device wafer. The interconnect layer consists of a plurality of elongated conductors separated from each other by a dielectric. Each of the elongated conductors has one end that is connected to one or more internal device contacts. The other end of the conductors is connected to one or more of the conductive filled vias. This structure is then covered by a protective or passivation layer such as silicon oxide or silicon nitride.

A second handle wafer is bonded to the protective layer. The second handle wafer is typically a glass wafer that has a coefficient of thermal expansion substantially the same as or otherwise compatible with the coefficient of thermal expansion of the device layer. The second handle wafer may also be silicon or a plastic encapsulant material. After the second handle wafer is in place, the first handle wafer is removed by chemical or mechanical etching or polishing or a combination of both techniques. The removal of the first handle wafer leaves in place the etch stop layer at the second surface of the device wafer. Then the ends of the conductive via on the second surface of the device wafer are exposed by etching contact windows through the etch stop layer. The foregoing assumes that the etch stop is a buried oxide layer. If the etch stop is a heavily doped layer, then an oxide is deposited on the exposed heavily doped layer and the deposited oxide is masked to provide openings to the conductive vias. External integrated circuit contacts are formed on the conductive vias for connecting one or more of the internal device contacts on the first layer through the conductive via to external circuits. These external circuit contacts may be typical bump contacts that are compatible with multichip module manufacturing techniques. In addition, other portions of the second surface of the device wafer may be exposed in order to establish further internal device contacts to regions on the bottom of the device wafer. In this way, collector or drain regions can be formed on the second surface of the device wafer, thereby eliminating the vertical sinker diffusions of the prior art and saving significant amounts of space in the integrated circuit. The internal contacts on the second surface may receive external (bump) contacts or may be connected to such external (bump) contact through a second interconnect layer. This feature enables more devices to be formed on a single die. Also, a second interconnect layer may be formed over the second surface of the device wafer in order to provide still further degrees of interconnection between the devices in the integrated circuit.

DETAILED DESCRIPTION

FIGS. 1–8 show sequential steps in a process for forming a field effect transistor in accordance with the teachings of the invention. This description will explain the sequential steps in that process and then will explain how the process is adapted to form other devices.

Figure 1:
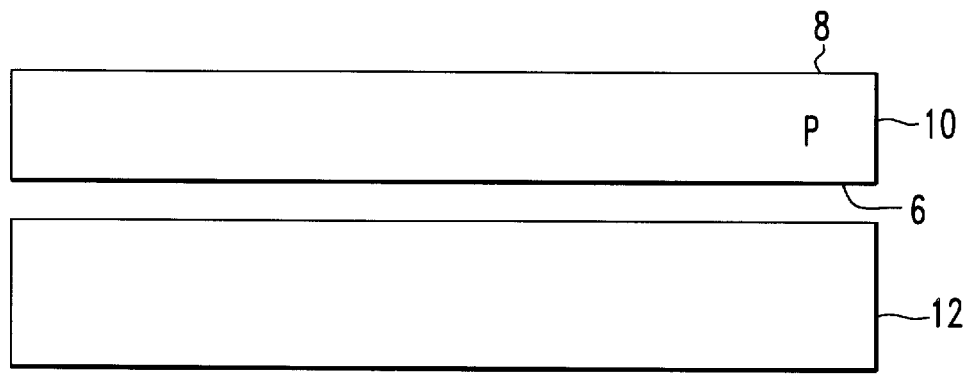
FIG. 1 shows a device wafer in a first handle wafer.
Figure 2:
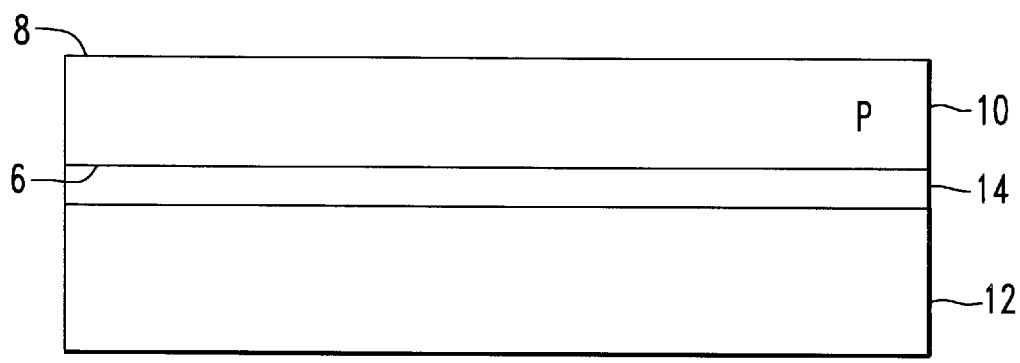
FIG. 2 shows a device wafer and a handle wafer separated by an etch stop layer.

Turning to FIG. 1, there is shown a typical semiconductor device wafer 10 that is lightly P-doped and has a first surface 8 and a second surface 6. A handle wafer 12 is also shown. Handle wafer 12 may also be a semiconductor substrate, in particular silicon or may be any other suitable substrate such as polysilicon, gallium arsenide, silicon carbide, diamond, etc. In the embodiment described below, both the device wafer 10 and the handle wafer 12 are silicon monocrystalline substrates.

The handle wafer 12 is bonded to the device wafer 10 using an oxide bond layer 14. The oxide bond layer 14 may be formed by any suitable technique including one or more of the techniques shown or described in U.S. patent application Nos. 5,517,047 or 5,387,555 assigned to the assignee of this invention. As an alternative, layer 14 may also be a highly doped layer formed in the surface of handle wafer 12 or in the second surface 6 of device wafer 10. A highly doped layer, such as a layer of boron doped to about $1-5\times10^{19}$ atoms/cm$^3$, will act as an etch stop as described hereinafter.

Figure 3:
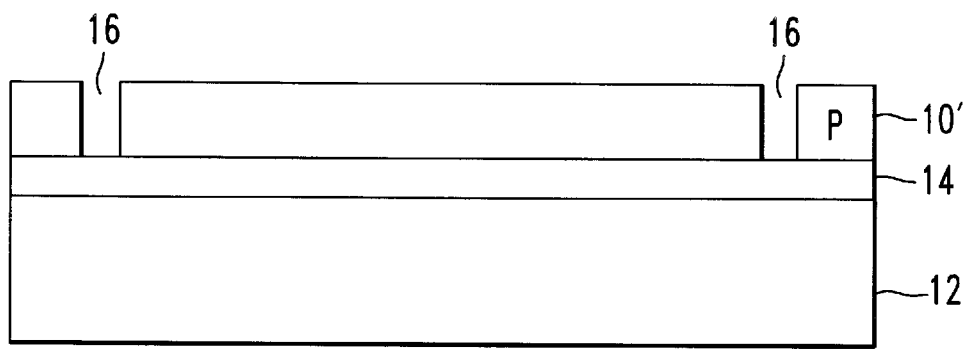
FIG. 3 shows the next step in a process forming isolating trenches.

The next step of the process is shown in FIG. 3. There, the device wafer 10 is first chemically or mechanically (or both) thinned to provide the device layer 10'. In a typical process the device layer is thinned to about 0.5–20 microns. Then the device layer 10' is patterned with photoresist to establish a pattern of isolation trenches. The isolation trench pattern is etched to provide the trenches 16 as shown in FIG. 3. Since the device layer 10' is thin the trenches 16 have relatively uniform aspect ratios and substantially vertical side walls. However, even though the trenches will slightly narrow at the ends on the etch stop 14, they will nevertheless be wide enough to provide external contact connections as indicated below.

Figure 4:
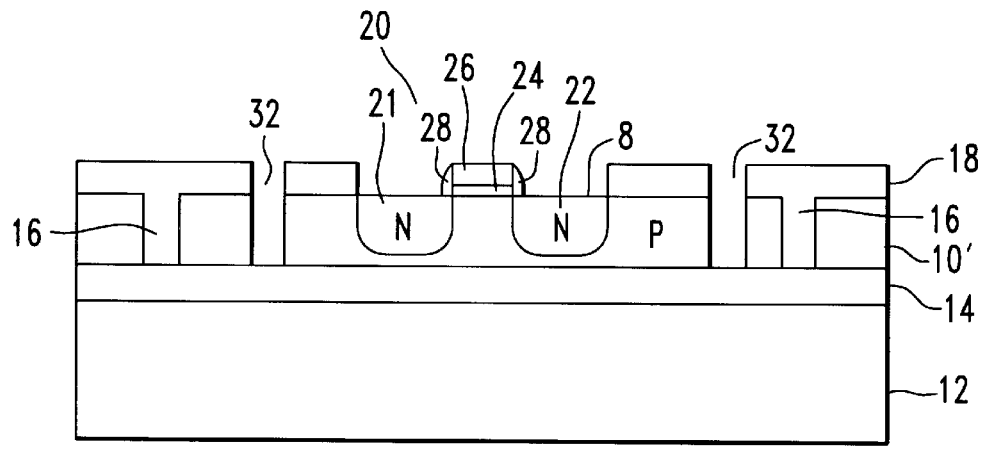
FIG. 4 shows a device formed in the first surface of the device layer.
Figure 5:
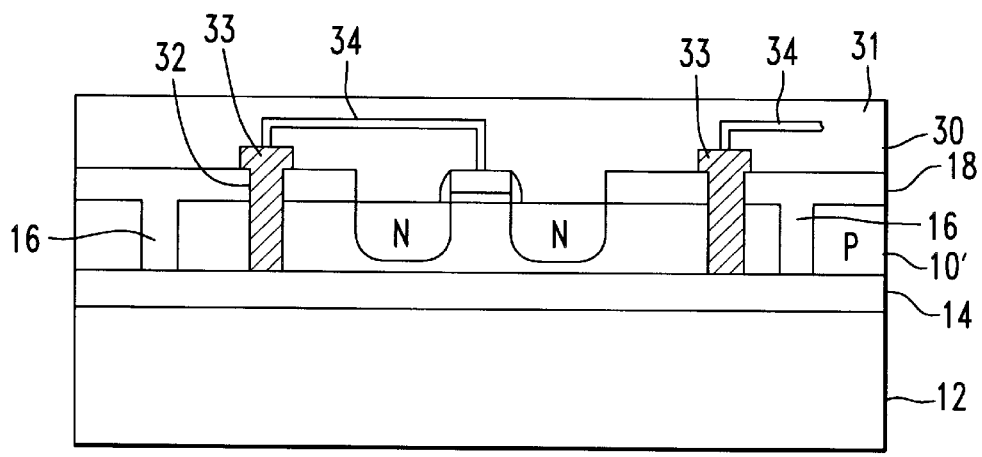
FIG. 5 shows the formation of an interconnect layer.

Turning to FIG. 4, a field effect transistor 20 is formed in the first surface 8 of the device layer 10'. In a manner well known in the art, N-type diffusions 21, 22 form the source and drain regions, respectively, of transistor 20. A gate oxide 24 is formed over the first surface 8 and a conductive gate material 26, typically doped polysilicon, is formed over the gate oxide 24. Side wall spacers 28 separate the source and drain regions and protect the sides of the conductive gate 26. An insulating layer 18 covers part of the device layer 10' and fills the isolation trench 16. Vias 32 are then formed through the insulating area 18 down to the etch stop layer 14. The vias 32 are then filled with conductive material 33 as shown in FIG. 5.

In the next step an interconnect layer 30 is formed over the first surface of the device layer 10'. The interconnect layer 30 comprises an insulating material 31 such as silicon dioxide, silicon nitride, or diamond. Within the insulating material 31 there are a plurality of conductors 34. The conductors 34 have one end in an electrical contact with internal device contact regions such as the gate 26 of FET 20. Those skilled in the art will appreciate that conductors 34 may also be in contact with either the source or drain regions 21, 22. The term "internal contact" is used to identify contacts of device on the die that are connected to other contacts on the die. These include but are not limited to contacts to source, gates and drains of fets, contacts to emitters and bases of bipolar transistor, contacts to anodes and cathodes of diodes, contacts to ends of resistors, contacts to plates of capacitors and contacts to windings of inductors. The conductors 34 may be connected to other conductors 34 and to other internal device contacts. One end of the conductor 34 is connected to the conductive material 33 in the via 32 for connecting the internal contacts on the first surface 8 to external circuits.

Figure 6:
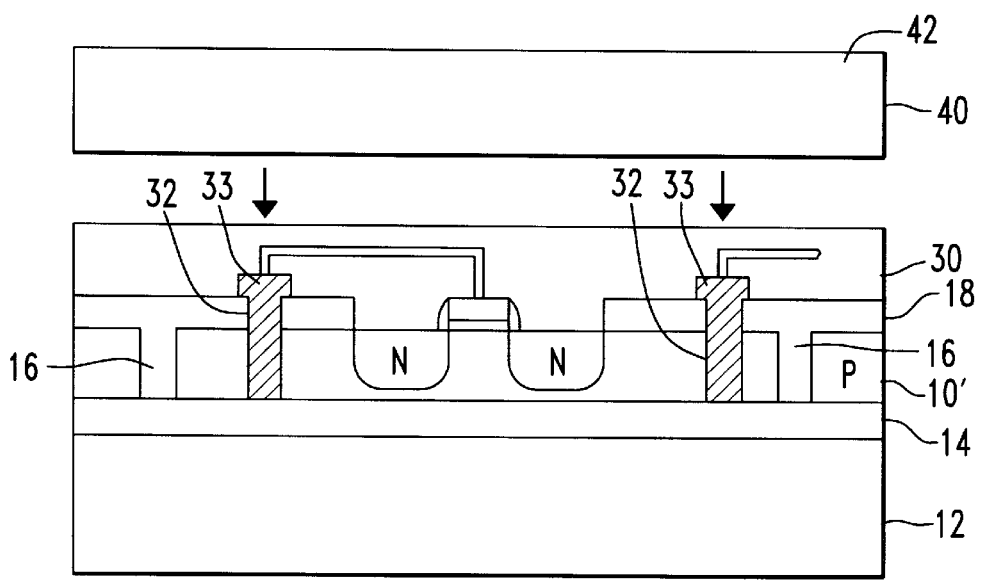
FIG. 6 shows the bonding of a second handle wafer.

As shown in FIG. 6, a second handle wafer 40 is then bonded to the interconnect layer 30. A key feature of second handle wafer 40 is its material 42. The material 42 has a thermal coefficient of expansion that matches the thermal coefficient of expansion of the device layer 10'. In its preferred embodiment, the material 42 is a glass such as NA45 and NA35 sold by Technoglass Corp. The glasses are specifically designed for active matrix LCD applications. NA35 is an aluminum silicon glass with a low thermal coefficient of expansion of $3.5 \times 10^{-7}$ per °C., a softening point of 650° C. and thermal shrinkage of 0.1 microns per centimeter when processed from 600° C. to room temperature. Second handle wafer 40 may also comprise the same material as the device layer 10', i.e. silicon. As an alternative a plastic encapsulant may be substituted for wafer 40. However, subsequent steps must be at relatively low temperature.

For typical MOS field effect transistors 20, the device layer 10' is approximately 0.5 microns thick. As such, the via 32 etched in the silicon may be easily filled with any suitable conductive material 33 such as silicided polysilicon, tungsten, or even aluminum. In many cases it is desireable to grow or deposit an insulator such as silicon dioxide on the sidewall of these trenches to provide electrical isolation. Present technology has the capability of refilling vias 32 that have a 5:1 aspect ratio. Another feature of the invention is that the sources and drains 21, 22 of the FETs may be extend to the bottom or second surface 6 of the device layer 10'. By bottoming out the source and drain diffusions, devices formed in the device layer 10' can have a second or back gate thereby making dual gate MOS devices feasible and simultaneously eliminating back channel leakage that is common to other fabrication techniques such as SIMOX.

Figure 7:
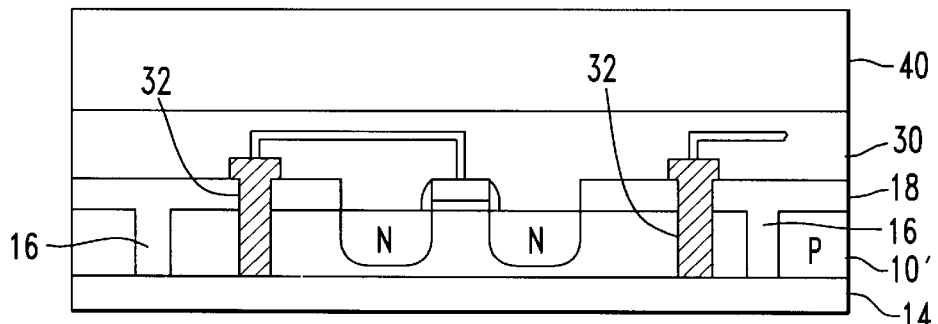
FIG. 7 shows removal of the first handle wafer.
Figure 8:
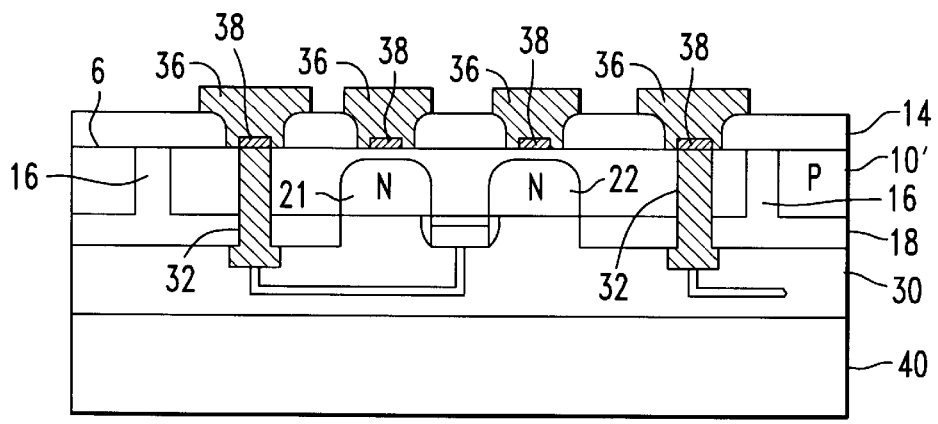
FIG. 8 shows external contacts formed over the second surface of the device layer.

As shown in FIGS. 7 and 8, the first handle wafer 12 is removed by chemical or mechanical methods or a combination of both methods to expose the etch stop layer 14. Selective portions of the etch stop layer 14 are removed in order to expose the second surface 6 of the device layer 10'. If layer 14 is a heavily doped etch stop layer, then an oxide layer is deposited on layer 14. The deposited oxide (not shown) is masked with photoresist and openings are made to the filled vias 32. External surface contacts 36 are then provided to contact the conductive material 33 in the vias as well as the bottomed out diffusions 21, 22 of the devices. Selective portions of the surface 6 may be silicide to provide silicided contacts 38. Silicide contacts 38 work in conjunction with the external integrated circuit contacts 36 to provide contact to the conductive materials in the vias 32 or to the bottomed out diffusion regions 21, 22. External contacts 36 may be bump contacts that are compatible with multichip module manufacturing. The external contacts 36 connect the internal contacts to external electrical circuits.

Figure 9:
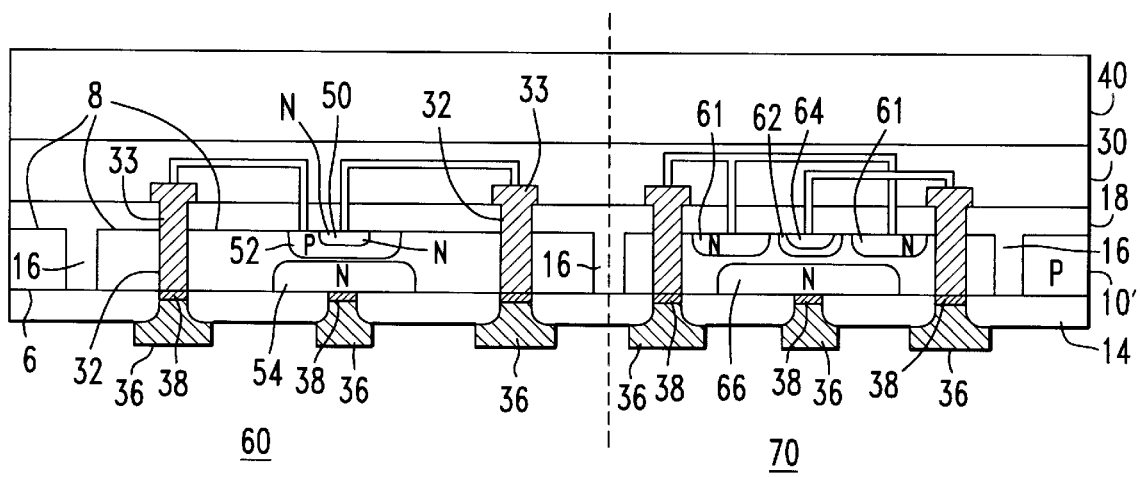
FIG. 9 shows a bipolar and a vertical MOS device formed using a process similar to that described in FIGS. 1–8.

Turning to FIG. 9, there is shown a device layer 10' having an NPN bipolar transistor 60 and a QVDMOS transistor 70. The bipolar transistor 60 has an emitter 50 that is N-doped and is surrounded by a base region 52 that is P-doped. The emitter 50 and the base 52 are both formed in the first surface 8 of the device layer. The collector 54 is formed in the second surface 6 on the device layer. A suitable opening is made in the silicon dioxide etch stop layer 14 so that N-type dopants may be diffused to form the collector 54. Then an external contact 36 is applied to the collector 54.

The vertical DMOS transistor 70 has source region 61 formed in the first surface 8 of the device layer 10'. A gate oxide 62 separates the conductive gate 64, typically doped polysilicon, from the two source regions 61. A drain region 66 is formed in the second surface 6 of the device layer 10' in a manner similar to the formation of the collector region, described above.

For both the bipolar device 60 and the vertical MOS device 70 the respective collector 54 and drain 66 diffusions are formed in the second surface 6 of the device layer. As such, both of those diffusions may be relatively shallow. Also, by forming the diffusions directly in the surface 6 and providing contacts 36 to the diffusions, it is no longer necessary to provide vertical or sinker diffusions for connecting the respective collector 54 and drain 66 to other device contacts. Instead, a second interconnect layer, not shown, can be used to connect internal device contacts on surface 6 to each other, to the internal contacts that are coupled to the vias 32 that are filled with conductive material 33 and to external surface contacts for connection to external circuits. As such, the invention eliminates the need for sinker diffusions as well as eliminates the need for thick buried layers and for thick epitaxial layers on QVDMOS devices. Accordingly, the device layer 10' can be substantially thinner than other device layers. A thin device layer 10' will rapidly dissipate heat thereby prolonging the life of the integrated circuit. Likewise, the above technique eliminates the thick epitaxial layers normally associated with discrete, vertical DMOS devices. Moreover, the above technique makes it possible to use existing processing techniques for intelligent power circuits and form true vertical field effect transistors rather than the quasivertical field effect transistors that are formed with existing techniques.

Those skilled in the art will appreciate that once the handle wafer 40 is removed, photolythographic operations are performed to expose and metalize the vias 32 and provide the external bump type contacts 36. The above techniques are compatible with bump bonding using ball grid array structure or using an interposer plate. The above techniques provide flexibility since the entire collector or drain regions 54, 66 can be metalized directly and directly bonded to a multichip module substrate to facilitate heat removal. Those skilled in the art will also appreciate that the above technique eliminates bond wires which are a serious source of parasitic inductive. Those skilled in the art will also appreciate that the above process is compatible with the process disclosed in U.S. Pat. No. 5,091,331 assigned to assignee of this invention. There it will be found in FIGS. 6 and 7 that backside contacts are provided to a device layer 10'. If the process shown in that patent is employed, then the through vias 32 may be performed at a later stage in the process in order to prevent metal contamination.

Figure 10:
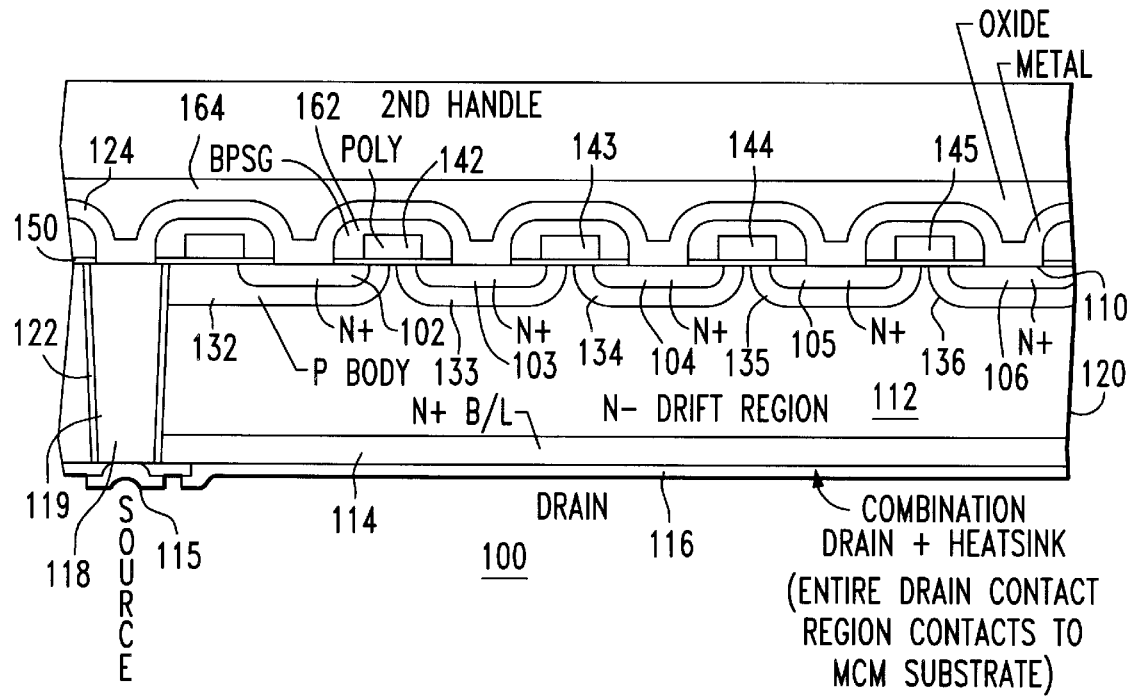
FIG. 10 shows a partial view of a vertical DMOS device with a heat sink drain contact.

With reference to FIG. 10, there is shown a partial view of a vertical DMOS transistor 100. An array of n+ source elements 102–106 are in the upper surface 110 of the device wafer 120. Each source element 102–106 is formed in one of the p body regions 132–136. Gates 142–145 are formed on an insulating layer 150 which is on the surface 110. The device wafer 120 has an n– drift region 112. At the bottom of the drift region 112 there is an n+ buried layer 114. A combination drain and heat sink contact 116 is on the surface of n+ buried 114. A source contact 115 includes the conductive material 118 (typically doped polysilicon) that fills via 119. Insulating layer 122 on the walls of the via 119 electrically separates the conductive material 118 from the rest of the device wafer 120. A metal interconnect layer 124 connects sources 102–105 to the source contact 115. The metal interconnect layer 124 is located between a lower layer of insulating material 162, typically borophosphosilicate glass (BPSG) and an upper layer of deposited insulating material 164 such as silicon dioxide or silicon nitride. A second handle wafer 150 covers the upper insulator 164. With the device 100, the drain contact 116 can be mounted on a multichip module and will serve the dual purposes of electrical contact and heat sink.

Figure 11:
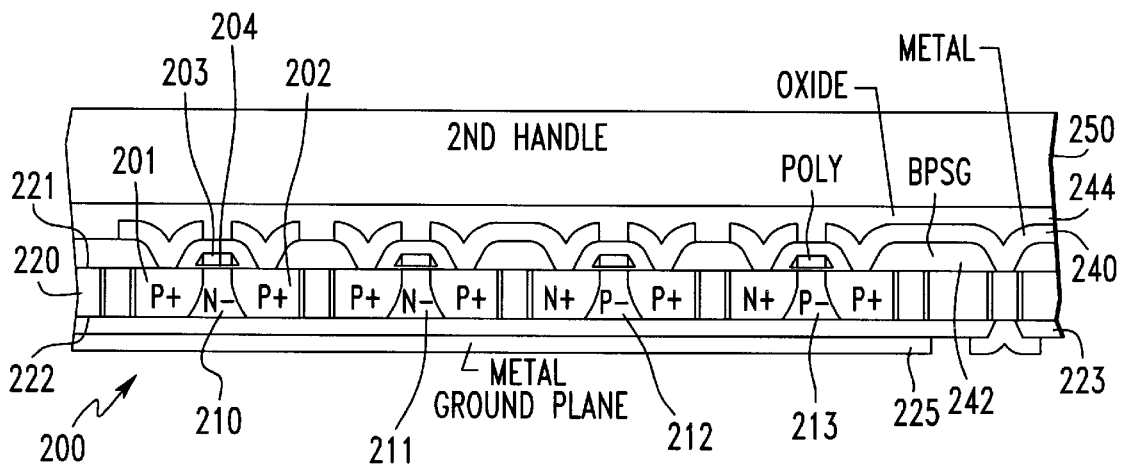
FIG. 11 is a partial view of a plurality of mos devices with a ground plane.

A device with a ground plane is shown in FIG. 11. The device 200 includes several pmos devices, 210–211 and several NMOS devices, 212–213. Each device has its p+ or n+ source/drain diffusion 201, 202 diffused from one surface 221 of substrate 220 to the other surface 222. An insulating layer 223, silicon oxide or silicon nitride, covers surface 222. A metal ground plane 225 is formed on the insulating layer 223. Contact to the sources/drains 201, 202 is made by interconnect layer 240 that is disposed between a lower insulating layer 242, typically BPSG, and an upper insulating layer 244, typically silicon dioxide or silicon nitride. Gates 203 of doped polysilicon are formed on gate oxide layer 203 that covers the upper surface 221. As second handle wafer 250 is bonded to the upper insulating layer 244.

While the foregoing description includes one or more particular embodiments of the invention, those skilled in the art will understand that further changes, modifications, and additions may be made to the disclosed embodiments without departing from the spirit and scope of the following claims.

We claim:

1. A method for fabricating a plurality of integrated circuits, each integrated circuit comprising one or more semiconductor devices comprising the steps of:

bonding a device wafer to a first handle wafer;

forming an etch stop layer between a first handle wafer and a device layer of semiconductor material;

thinning the device wafer to form a device layer;

forming integrated circuits, each circuit comprising one or more semiconductor devices, in an exposed first surface of the device layer;

forming insulated trenches between adjacent integrated circuits to isolate each integrated circuit from other integrated circuits, each device having one or more internal device contacts;

forming a device interconnect layer over the device layer for interconnecting the internal device contacts of each integrated circuit;

forming vias between the interconnect layer and the etch stop layer;

forming an insulating layer on the walls of the vias;

filling the vias with conductive material;

bonding a second handle wafer to the exposed surface of the device layer;

removing the first handle wafer and exposing at least portions of a second surface of the device layer, said second surface opposite the first surface of the device layer; and forming surface contact regions on the second surface of the device layer for connecting the one or more of the internal device contacts to external circuits.

2. The method of claim 1 wherein the exposed portions of the second surface correspond to the filled vias.

3. The method of claim 1 wherein the exposed portions of the second substrate correspond to terminals of devices formed in the device layer.

4. The method of claim 1 wherein selected exposed portions of the second surface of the device layer are doped to form terminals of devices in the device layer.

5. The method of claim 4 wherein at least one selected exposed portion of the second surface of the device layer is doped to form a drain terminal of a field effect transistor in the device layer.

6. The method of claim 4 wherein at least one selected portion of the second surface of the device layer is doped to form a collector terminal of a bipolar transistor.

7. The method of claim 4 further comprising the step of forming a back gate on at least one portion of the second surface of the device layer.

8. The method of claim 1 wherein the second handle wafer comprises a material having a thermal coefficient of expansion compatible with the thermal coefficient of expansion of the device layer.

9. The method of claim 8 wherein the device layer and the second handle wafer are the same material.

10. The method of claim 9 wherein the device and the second handle wafer are silicon.

11. The method of claim 8 wherein the device layer comprises silicon and the second handle wafer comprises glass.

12. The method of claim 11 wherein the glass comprises an aluminum-silicon glass.

13. The method of claim 8 wherein the second handle wafer comprises a plastic encapsulant.

14. The method of claim 1 wherein the integrated circuits comprise field effect transistors having source and drain diffusions that extend from the first surface of the device layer to its second surface.

15. The method of claim 1 wherein the integrated circuits comprise vertical field effect transistors wherein the source diffusions are in the first surface of the device layer, a gate extends into the device layer between adjoining source diffusions and the drain layer is formed in the second surface of the device layer.

16. The method of claim 1 wherein the integrated circuits comprise bipolar transistors having base and emitter diffusions in the first surface of the device layer and a collector diffusion in the second surface of the device layer.

17. The method of claim 1 wherein the etch stop layer is a dielectric.

18. The method of claim 17 wherein the dielectric is one selected from the group consisting of silicon dioxide, silicon nitride and diamond.

19. The method of claim 1 wherein the etch stop layer is layer of a highly doped impurity ion.

20. The method of claim 19 wherein the impurity ion is boron and its concentration is about $1-5\times10^{19}$ atoms/cm$^3$.

21. The method of claim 1 wherein the vias and the isolation trenches are formed at the same time.

22. The method of claim 1 wherein the surface contact regions on the second surface of the device layer comprise ball grid arrays.

23. The method of claim 1 wherein the surface contact regions on the second surface of the device layer comprise a ground plane.

24. The method of claim 1 further comprising the step of forming a second interconnect layer on the second surface of the device layer.

25. The method of claim 1 wherein the vias are filled with polysilicon.

26. The method of claim 25 comprising the further step of siliciding the polysilicon in the vias.

27. The method of claim 1 wherein the vias are filled with metal.

28. The method of claim 27 wherein the metal is one selected from the group consisting of aluminum and a refractory metal.

29. The method of claim 1 comprising the further step of selectively removing material from the second surface of the device layer to expose the conductive material in the vias.

30. The method of claim 1 comprising the further step of selectively siliciding portions of the second surface of the device layer.

31. The method of claim 1 comprising the further step of opening vias in the second handle wafer over selected regions on the first surface of the device layer and filling the vias with conductive material for establishing electrical contact to the selected regions on the first surface of the device layer.

* * * * *